(12) United States Patent
Haroun et al.

(10) Patent No.: US 10,547,438 B2
(45) Date of Patent: Jan. 28, 2020

(54) SIGNAL EDGE LOCATION ENCODING (71) Applicant: TEXAS INSTRUMENTS INCORPORATED, Dallas, TX (US)

(72) Inventors: Baher Haroun, Allen, TX (US); Tobias Bernhard Fritz, Mainburg (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 56 days.

(21) Appl. No.: 15/858,537

(22) Filed: Dec. 29, 2017

(65) Prior Publication Data

US 2019/0207742 A1 Jul. 4, 2019

(51) Int. Cl.
*H04L 7/027* (2006.01)
*H04J 3/06* (2006.01)
*G05B 15/02* (2006.01)

(52) U.S. Cl.
CPC .............. *H04L 7/0278* (2013.01); *H04J 3/06* (2013.01); *G05B 15/02* (2013.01)

(58) Field of Classification Search
CPC ... H04L 7/0278; H04L 12/741; H04L 12/743; H04L 12/861; H04L 29/06; H04L 45/745; H04L 49/90; H04L 69/22; H04L 45/7457; H04J 3/06; H04J 3/07; H04J 3/0605; H04J 3/1611; G05B 15/02; G09G 5/06; G09G 5/39; G09G 5/36; G09G 3/006; G09G 5/006; G09G 5/363; G09G 2360/123; H04N 19/44; H04N 19/117; H04N 19/42; H04N 19/46; H04N 19/85; H04N 21/42623
See application file for complete search history.

(56) References Cited

U.S. PATENT DOCUMENTS

| | | |
|---|---|---|
| 7,184,466 B1 | 2/2007 | Seemann et al. |
| 7,230,956 B1 * | 6/2007 | Ambrose .............. H04J 3/0605 370/503 |
| 2003/0081782 A1 * | 5/2003 | Coles .................... H03M 5/145 380/260 |
| 2010/0201188 A1 | 8/2010 | Robbins |
| 2011/0038286 A1 | 2/2011 | Ta et al. |
| 2014/0307759 A1 | 10/2014 | Sundar |
| 2015/0131643 A1 | 5/2015 | Oren |
| 2016/0188395 A1 | 6/2016 | Buehler |
| 2016/0295221 A1 * | 10/2016 | Altmann .......... H04N 21/42623 |
| 2017/0093715 A1 * | 3/2017 | McGhee ............... H04L 45/745 |
| 2018/0191049 A1 | 7/2018 | Kamgaing et al. |

* cited by examiner

*Primary Examiner* — Hardikkumar D Patel
(74) *Attorney, Agent, or Firm* — Michael A. Davis, Jr.; Charles A. Brill; Frank D. Cimino (57) ABSTRACT

A circuit includes a serializer module that includes an input stage that samples an input signal to capture an edge location for each of the input signal in a given time frame. An edge encoder encodes the edge location for the input signal into a packet frame to specify where the edge location occurs in the given time frame for the input signal. A transmitter receives the packet frame from the edge decoder and converts the packet frame into a serial data stream. The transmitter communicates the edge location for the input signal via the serial data stream.

16 Claims, 8 Drawing Sheets

| | FRAME: ONE FRAME EVERY 14 nsec | | | | | | | NUMBER OF BITS / FUNCTION | | TOTAL BITS IN FRAME |
|---|---|---|---|---|---|---|---|---|---|---|
| | 2nsec | 2nsec | 2nsec | 2nsec | 2nsec | 2nsec | 2nsec | EDGE LOCATION | EDGE POLARITY | |
| SLOT INDEX | 1 | 2 | 3 | 4 | 5 | 6 | 7 | | | 14 |
| PWM 1 | | / | | | | | | 3 | 1 | 4 |
| PWM 2 | | | | / | | | | 3 | 1 | 4 |
| PWM 3 | | | | | | / | | 3 | 1 | 4 |
| SERIAL | | | / | | | | | 1 | 1 | 2 |

SIGNAL EDGE LOCATION ENCODING

TECHNICAL FIELD

This relates generally to electrical circuits, and more particularly to encoding signal edge locations in a serial data stream.

BACKGROUND

A motor controller is a device, circuit or system that governs, in some predetermined manner, the performance of an electric motor. For example, in three-phase alternating current (AC) motors, separate phase windings of the motors are controlled and timed, such that one phase is activated as another phase is deactivated, in order to cause the motor to rotate properly. The motor controller is usually coupled to a motor power module to drive the individual phases of the motor. In some examples, the motor controller module is electrically isolated from the motor power module via isolation circuits (e.g., isolated gate drivers) that couple the respective controller and power modules. In the example of a three-phase motor system (including a high-side and low-side driver for each phase of the motor), if full isolation is required between each driver, then six isolation circuits would be provided to isolate each driver from one another and common circuit paths (such as ground). To fabricate respective controller and power module interfaces, a higher cost is incurred to individually isolate the driver circuits and associated control signals to control and monitor the motor.

SUMMARY

In one example, a circuit includes a serializer module, which includes an input stage that samples an input signal to capture an edge location for the input signal in a given time frame. An edge encoder encodes the edge location for the input signal into a packet frame to specify where the edge location occurs in the given time frame for the input signal. A transmitter receives the packet frame from the edge decoder and converts the packet frame into a serial data stream. The transmitter communicates the edge location for the input signal via the serial data stream.

In another example, a circuit includes a deserializer module, which includes a receiver that receives a serial data stream from a transmitter. The serial data stream includes at least one packet frame to specify respective edge locations for input signals from the transmitter in a given time frame. An output stage writes the packet frame(s) from the receiver into a buffer. An edge decoder decodes the respective edge locations from the packet frame(s) in the buffer with respect to the given time frame to generate parallel output signals to communicate control information with a motor power module or a motor controller module.

In yet another example, a method includes sampling input signals to determine respective edge locations corresponding to transitions of the input signals in a given time frame. The method includes encoding the respective edge locations for the sampled input signals into at least one packet frame to specify where the respective edge locations occur in the given time frame for the sampled input signals. The method includes encoding respective polarities into the packet frame(s) to specify directions of signal transitions at the respective edge locations. The method includes converting the packet frame(s) into a serial data stream that communicates the respective edge locations and the respective polarities for the sampled input signals via the serial data stream.

DETAILED DESCRIPTION

This description relates to a circuit to encode signal edge locations in a serial data stream for communicating timing and control information. Parallel signals can be grouped and serialized into a serial data stream via an input stage at one end of the circuit and de-serialized into parallel signals via an output stage at the other end, in order reduce isolation circuits between a motor controller module and a motor drive power module. The circuit includes a serializer module, which includes the input stage, an edge encoder and a transmitter. The input stage samples input signals (e.g., parallel output signals from a motor controller or motor power module) to capture an edge location for each of the input signals in a given time frame. For example, one or more pulse width modulated (PWM) signals may be sampled over time to capture where an edge transition (e.g., a rising or falling edge) occurs within a given set of samples. The location where the edge transition occurs defines the edge location. The edge encoder encodes the edge location for each of the input signals into a packet frame that specifies where the edge location occurs in the given time frame for each of the respective input signals. For example, instead of providing all of the sampled signal information of a given signal, the edge encoder encodes where the transition occurs and transmits the location, which saves several bits in the serial stream that have to be transmitted.

After encoding, the transmitter receives the packet frame from the edge encoder and converts the packet frame into the serial data stream. The transmitter communicates the edge location and polarity for each of the input signals via the serial data stream. A deserializer module can receive the serial data stream and includes a receiver, an output stage, and edge decoder. The receiver receives the serial data stream from the transmitter and the output stage stores the packet frame received in the serial data stream in a buffer. The edge decoder decodes the edge location from the packet frame for each of the input signals with respect to the given time frame to generate parallel output signals to communicate control and timing information with a motor power module or a motor controller module.

For example, if a given signal was sampled and captured as sampled signal "0001111" having seven bits, then the edge location is encoded as "100" indicating that the edge occurred at the fourth bit location, thus reducing the bandwidth communicated in the serial data stream from seven bits to three bits (a savings of 4 bits for other data). Also, the polarity of the signal edge can also be communicated in the packet frame (e.g., whether the edge transitioned from high to low or low to high). This type of encoding decreases the number of bits that are to be transmitted in the serial data stream, while increasing the communication performance of the serial channel.

In addition to efficient encoding and decoding of the edge location, timing between signals is maintained by encoding and decoding timing information relating to multiple signals within the same packet frame. With respect to a motor drive example, if a PWM high signal and a PWM low signal were to be communicated, it is desirable that both signals are not active at the same time in order to mitigate power surges in the motor windings. To maintain such timing during the serialization process, both the high side and low side PWM signals can be sampled concurrently and packetized in the same packet frame. This packet frame can then be serialized and decoded in such as manner as to maintain the timing relationship between the high and the low side signals upon decoding. In this manner, timing information and synchronicity between signals is maintained during the serialization and deserialization processes.

Each of the serializer and deserializer modules can be combined at both ends of a circuit to provide bidirectional serial communications between a sender module and a receiver module. Parallel signals at each end of the system are converted to serial signals to mitigate requirements in the system, such as multiple independent isolation circuits, with timing maintained due to encoding of multiple signals within a given packet frame. As an example, a separate serial-deserializer (SER-DES) module can be coupled respectively to a motor controller module and the motor drive power module, where the respective SER-DES module converts parallel signals from each of the modules into serial data streams, which are multiplexed (e.g., via time-division or frequency division multiplexing) to maintain synchronization between the controller and the power module.

As used herein, the term "circuit" can include a collection of active and/or passive elements that perform a circuit function, such as an analog circuit or control circuit. Additionally or alternatively, for example, the term "circuit" can include an integrated circuit (IC) where all and/or some of the circuit elements are fabricated on a common substrate (e.g., semiconductor substrate, such as a die or chip).

Figure 1:
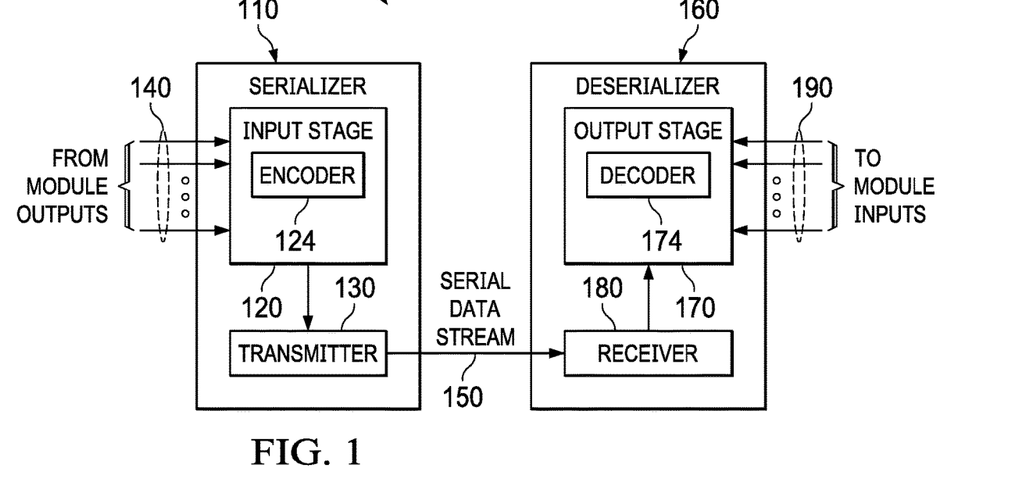
FIG. 1 illustrates an example circuit to encode signal edge locations in a serial data stream.

FIG. 1 illustrates an example circuit to encode signal edge locations in a serial data stream for communicating timing and control information in a motor drive circuit 100. The motor drive circuit 100 includes a serializer module 110 that includes an input stage 120, edge encoder 124, and a transmitter 130. The input stage 110 samples input signals to capture an edge location for each of the input signals 140 in a given time frame (e.g., over several sample clock cycles). As used herein, the term edge location refers to where an edge transition occurs in a given sampled packet for the input signals 140. For example, if a given input signal 140 was sampled in a shift register via a sample clock and captured as sampled signal "0100000" having seven bits by the input stage 120, then the edge location can be encoded as "010" by the edge encoder 124 indicating that the edge transition occurred between the second bit location of the sampled signal 140 and thus saving four bits that need to be transmitted in a serial data stream 150.

Also, a polarity of the signal edge can be encoded and communicated in the serial packet frame. Polarity in this context refers to whether the signal edge transitions from high to low (a falling edge) or low to high (a rising edge). The edge encoder 124 encodes the edge location and polarity for each sample of the input signals 140 into a packet frame that specifies where the edge location occurs and edge polarity in the given sample for each of the respective digital input signals. The transmitter 130 receives the packet frame from the edge decoder 124 and converts the packet frame into the serial data stream 150. The transmitter 130 communicates the edge location and edge polarities for each of the input signals 140 via the serial data stream 150. In one example, the input stage 120 can include a separate shift register to capture an edge transition in response to a sample clock for each of the respective input signals 140 (see e.g., FIG. 3).

In some examples, the sample size for each input sample is selected such that the edge transition specified in the packet frame of the serial data stream 150 includes one input signal transition from a high state to a low state or a low state to a high state for each input sample. As described hereinabove, the edge encoder 124 provides an encoded packet frame that includes data specifying an edge location for a signal to begin at a given time period (location) within the packet frame and an edge polarity that specifies a rising or falling edge for the signal at the respective edge location.

A deserializer module 160 receives the serial data stream 150. The deserializer 160 includes an output stage 170, an edge decoder 174, and a receiver 180. The receiver 180 receives the serial data stream 150 from the transmitter 130 via a communications link (e.g., an electrically conductive or wireless link). In some examples, the link may provide galvanic isolation between the modules 110 and 160. The output stage 170 includes a storage buffer to hold the received packet frame from the serial data stream 150. The edge decoder 174 decodes the edge location from the packet frame stored in the buffer for each of the input signals 140 with respect to the given time frame to generate parallel output signals 190 to communicate control information (see e.g., FIG. 7). Each of the serializer and deserializer modules 110 and 160 can include a phased-locked loop (PLL) (see, e.g., FIG. 2) to synchronize the serial data streams communicated between the respective modules. Also, each of the serializer and deserializer modules 110 and 160 can be implemented on an integrated circuit substrate.

Figure 2:
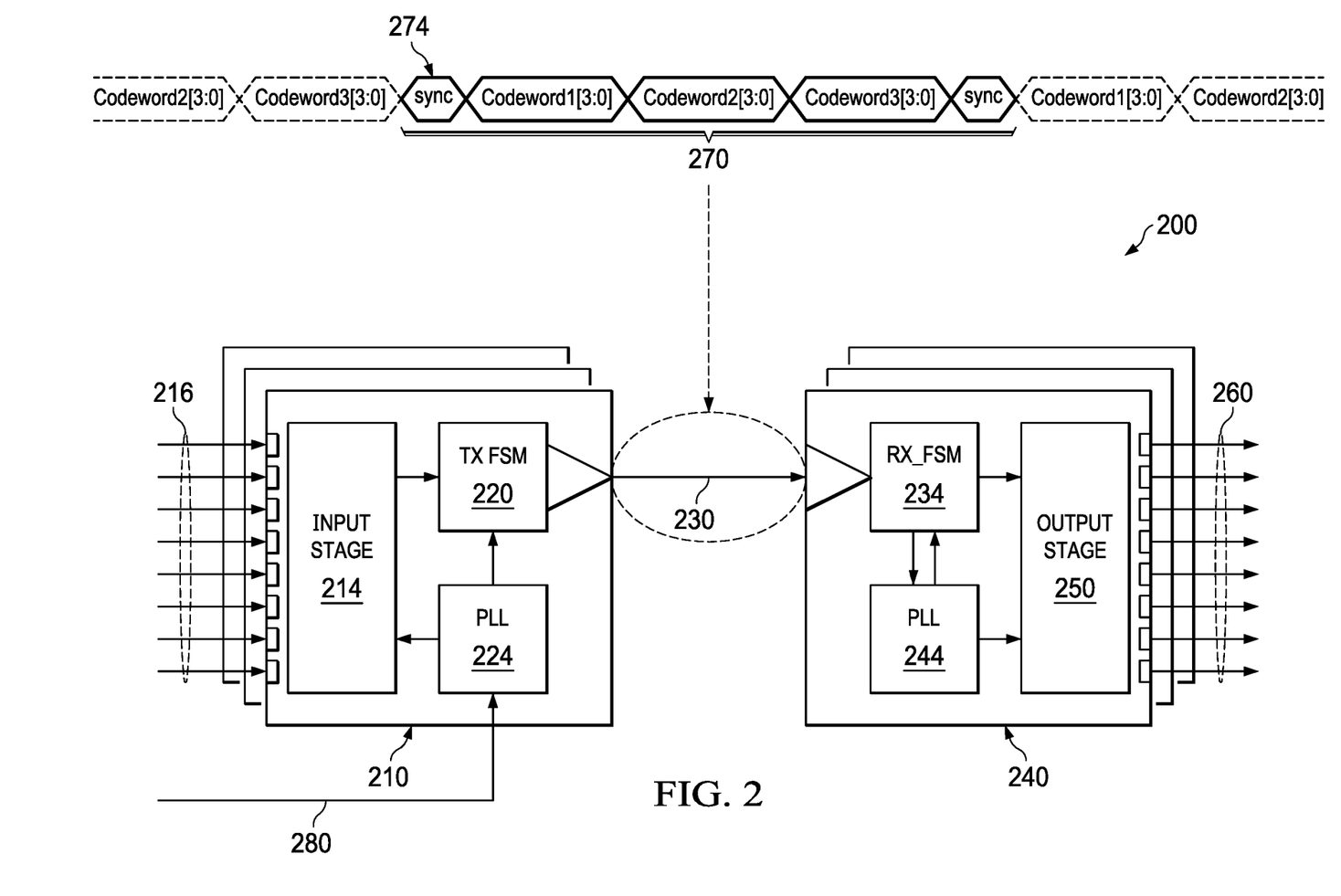
FIG. 2 illustrates an example circuit to encode signal edge locations in a serial data stream for communicating timing and/or control information via a packet frame.

FIG. 2 illustrates an example circuit 200 to encode signal edge locations in a serial data stream for communicating timing and control information via a packet frame. The circuit 200 includes a serializer 210 that includes an input stage 214 to encode edge locations and edge polarity (e.g., via an edge encoder not shown) for input signals at 216. A transmitter 220 shown as TX finite state machine (FSM) transmits serial data representing the encoded edge locations along with other data. A phase locked loop 224 controls module timing. The transmitter 220 communicates via serial data stream 230 to a receiver shown as RX FSM 234 in a deserializer module 240. A phase lock loop 244 controls module timing of the deserializer 240. An output stage 250 includes an edge decoder (not shown) and converts serialized signals received from the serial data stream 230 to parallel output signals at 260.

An example packet frame is shown at 270 and includes a synchronization sequence 274 and a separate codeword representing encoded edge and polarity representations of the input signals 216. In this packet frame example, three codewords 1, 2, and 3 are shown but more or less than three codewords can be communicated in other examples. Each codeword in this example includes four bits with three bits specifying the edge location and one bit specifying the edge polarity. To maintain desired timing between signals, the edge encoder described herein can encode multiple signal edge locations for multiple input signals that are sampled by the input stage concurrently which are then decoded concurrently at the output stage. Thus, timing is maintained between the input signal edge locations within the packet frame.

For example, to provide synchronization between modules, the serializer 210 sends synchronization sequence 274 such as AAA hex (one or more times) followed by 000h. This sequence 274 synchronizes PLL frequencies synchronizes transmit and receive counters, FSMs, and so forth. Bandwidth of the communication link between modules can be related to a sampling clock frequency at 280. For example, a 7 Bit input stage example would provide codeword length of 12 Bits+1 Bit PLL synchronization. Sync pulses can periodically update the PLL 2224 and/or 244. The communication link can operate in this example at (13/7*Sample Frequency).

Figure 3:
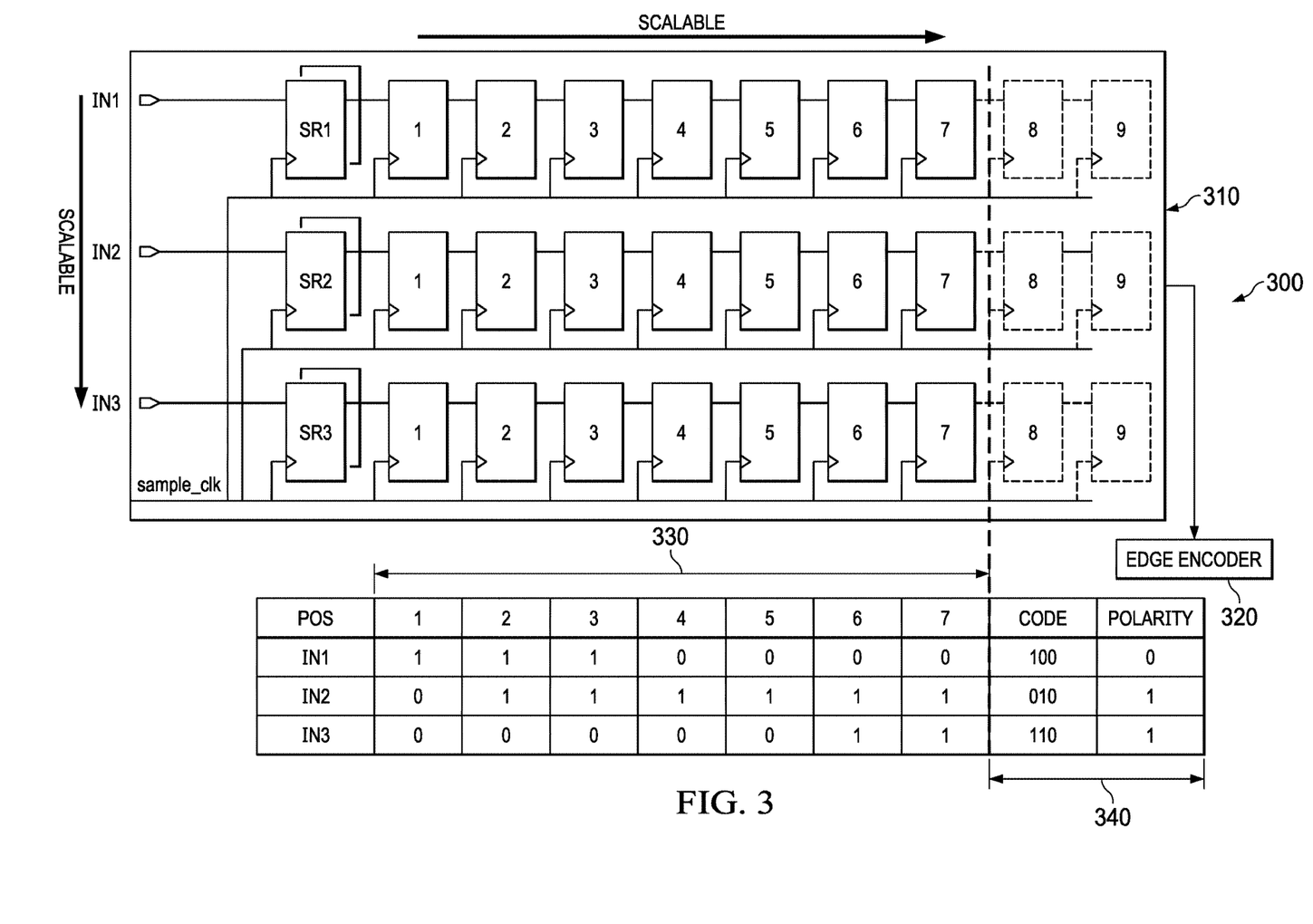
FIG. 3 illustrates an example input stage and edge encoder to encode signal edge locations in a serial data stream for communicating timing and/or control information.

FIG. 3 illustrates an example input stage 310 and edge encoder 320 to encode signal edge locations in a serial data stream for communicating timing and control information in a motor drive circuit. The input stage samples input signals shown as IN1 to IN3 to capture an edge location for each of the input signals in a given time frame. A separate shift register SRI through SR3 is provided to capture each respective input IN1 to IN3. More or less than three inputs can be sampled than shown in this example with the number of shift registers in the input stage 310 scaled to match the number of sampled inputs. The number of registers in each shift register is defined such that captured events from the inputs have a maximum frequency of occurrence. Thus, the number shift register length and thus sample size can be determined by a design guideline that events on the inputs have a maximum frequency of occurrence. In the example of FIG. 3, seven registers are configured for each shift register to accommodate a priori design information that a given input signal should not transition more than once within seven sample clock cycles, which is applied to the respective shift registers. Other shift register lengths can be selected in other examples, such as depending on the frequency of the input signals and the sample clock frequency.

An edge encoder 320 encodes the edge location for each of the input signals IN1 though IN3 into a packet frame that specifies where the edge location occurs in the given time frame for each of the respective input signals. At 330, three example signal captures are illustrated. For IN1, the captured signal is "1110000." For IN2, the captured signal is "0111111." For IN3, the captured signal is "0000011." The edge encoder 320 can be a processor and/or logic circuit that analyzes the captured code samples that have been loaded into the shift registers, indicated at 330, to generate encoded versions at 340. In this example, the encoded versions include 3 bits for the edge location and 1 bit for the edge polarity. For input sample IN1, the edge location is encoded as "100" with the edge polarity a zero indicating the edge transition was from a high state to a low state. For input sample IN2, the edge location is encoded as "010" with the edge polarity a one indicating the edge transition was from a low state to a high state. For input sample IN3, the edge location is encoded as "110" with the edge polarity a one indicating the edge transition was from a low state to a high state. Other encoding schemes may be used in other examples.

Figure 4:
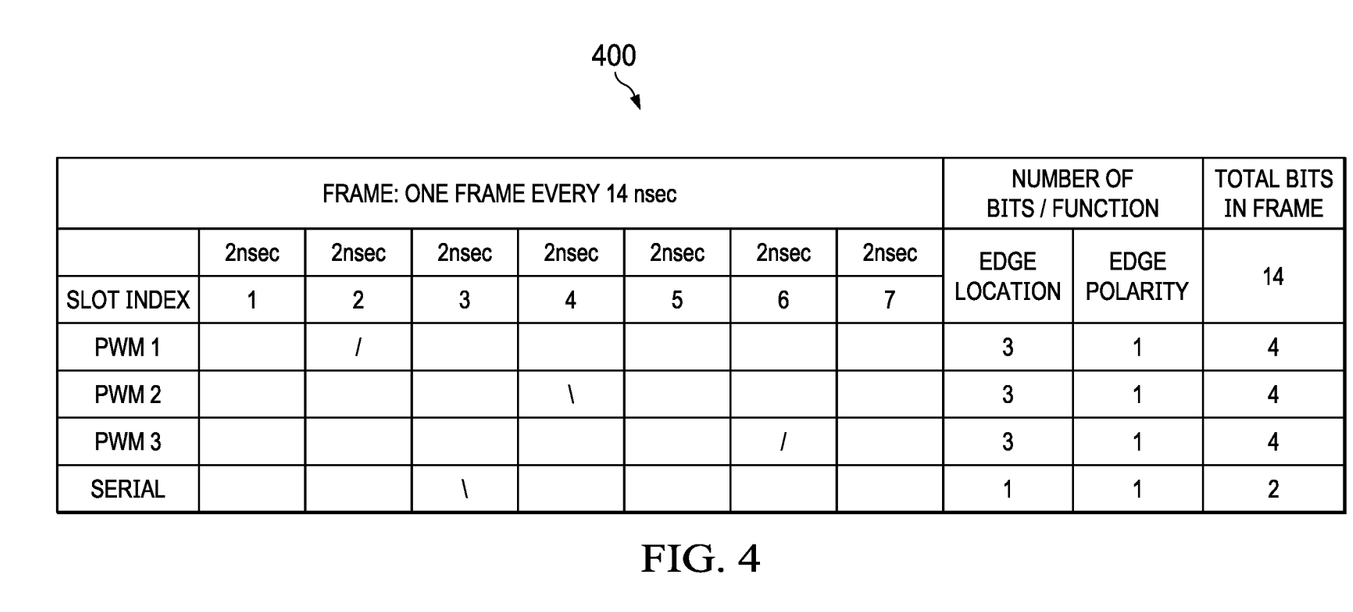
FIG. 4 illustrates an example of a time-formatted packet frame that is transmitted as a serial data stream.

FIG. 4 illustrates an example of a time-formatted packet frame 400 that is transmitted as a serial data stream in a motor drive circuit. In this example, each of three pulse-width modulated (PWM) motor drive signals PWM1, PWM2, and PWM3 are sampled by a 500 MHz clock. This will provide an edge resolution of about 2 nsec. However, in other examples, other sampling times can be used. One serial signal SERIAL can be sampled by a 500/7=71.4 MHz clock providing edge resolution of about 14 nsec. For each signal, three bits are employed to specify where in the frame 400 and edge begins. For example, bit pattern 010 would specify the edge location for PWM1 in slot index 2 of the frame. Bit pattern 100 would indicate PWM2's edge would start at slot index 4 of the frame, and so forth. Each of the respective channels can also specify an edge polarity via a single extra bit per channel where a "0" can specify a falling edge and "1" can specify a rising edge for the signal specified in time via the slot index of the frame. Thus, in this example with three PWM channels and one serial channel, 10 bits are utilized to specify the edge locations for each of the respective channels within the frame 400 and 4 bits are utilized to specify the edge polarity for each channel within the frame.

As a further example, the packet frame 400 can be transmitted at approximately 1 Gbps across the isolation boundary. A protocol can be developed across the two sides (e.g., using the serial channel) to coordinate and transmit low bit rate feedback and other general purpose input/output (GPIO) data. If the 14 bit frame is formatted in this example and transmitted, the latency will be less than about 50 nsec (e.g., about at least 28 nsec). When no edges exist to transmit, the polarity bits are redundant and could be used for exception processing, but an all zero transmission can be transmitted to conserve energy of the channel and reduce power when no edges exist. Even though the PWM signal could be approximately 100 KHz, frames can still exist where no bits are being transmitted. This achieves an example jitter target (e.g., +/−2 nsec), latency e.g., <50 nsec, and power efficiency.

Figure 5:
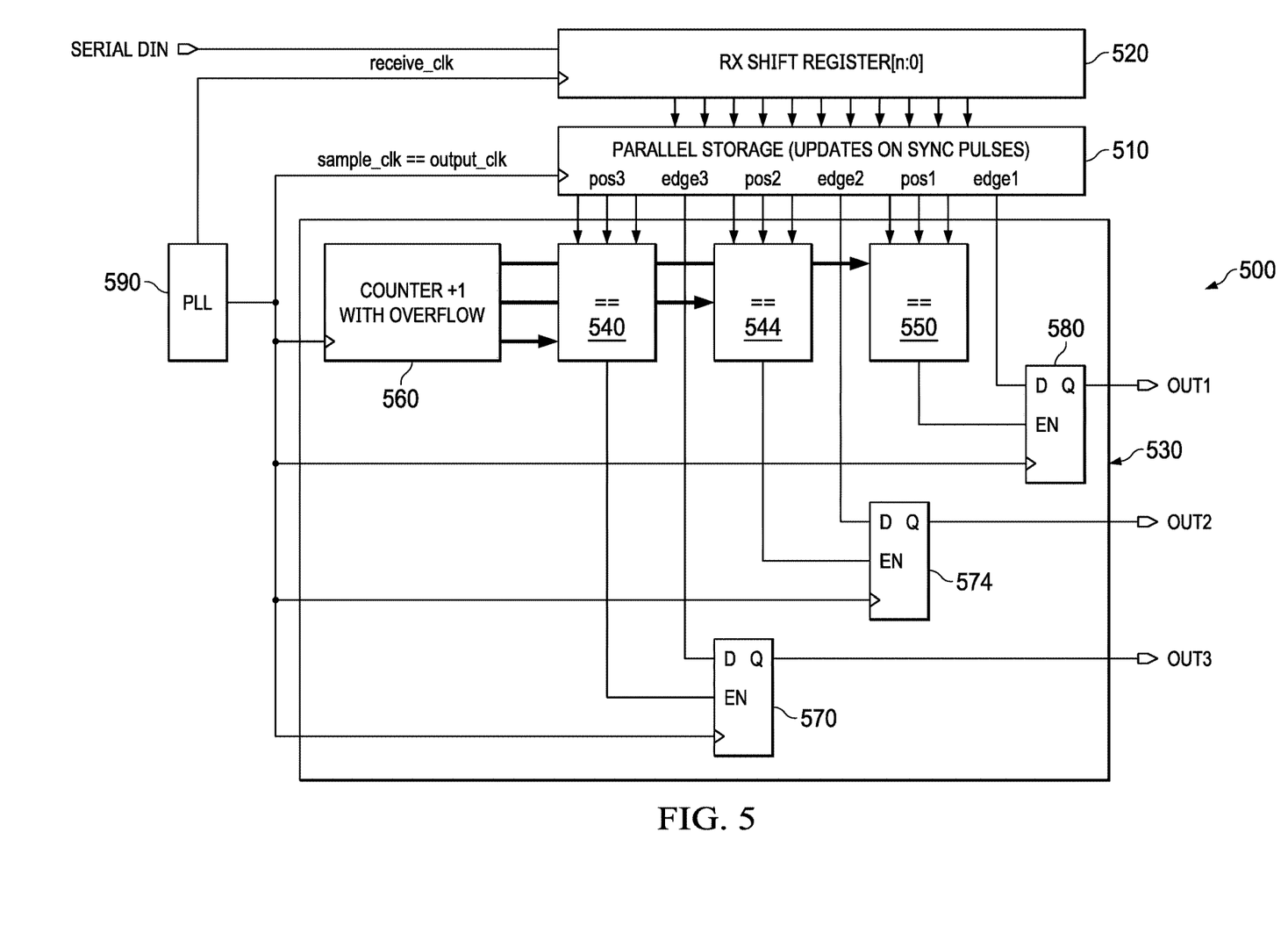
FIG. 5 illustrates an example output stage and edge decoder to decode signal edge locations in a serial data stream for communicating timing and/or control information-.

FIG. 5 illustrates an example serializer circuit 500 that includes an output stage 510, receiver 520, and edge decoder 530 to decode signal edge locations in a serial data stream for communicating timing and control information in a motor drive circuit. The receive shift register 520 captures the packet frame from the serial data stream in response to a receive clock signal (receive_clk) to shift the serial data stream into the receive shift register. The output stage 510 includes a parallel storage register (also referred to as buffer) to store separate output codes captured by the receive shift register 520. The output codes represent an edge location and a polarity for each of the input signals specified in the packet frame of the serial data stream. The output stage includes a separate comparator 540, 544, and 550, and a counter 560 to decode each of the separate output codes form the storage buffer 510. For example, a respective comparator compares one of the separate output codes to a counter value of the counter 560 to determine the edge location from the packet frame stored in the parallel storage register. An edge polarity bit in the packet frame is clocked to an output of the output stage via flip flops 572, 574, and 580, in response to the respective comparator matching a counter value to the output code. As an example, the comparators 540-550 can be implemented as XOR comparators that produce a logic one of the inputs between the counter and the respective comparator are different and a logic zero if the inputs between the counter and the respective comparator are the same. A phase locked loop 590 controls circuit timing.

Figure 6:
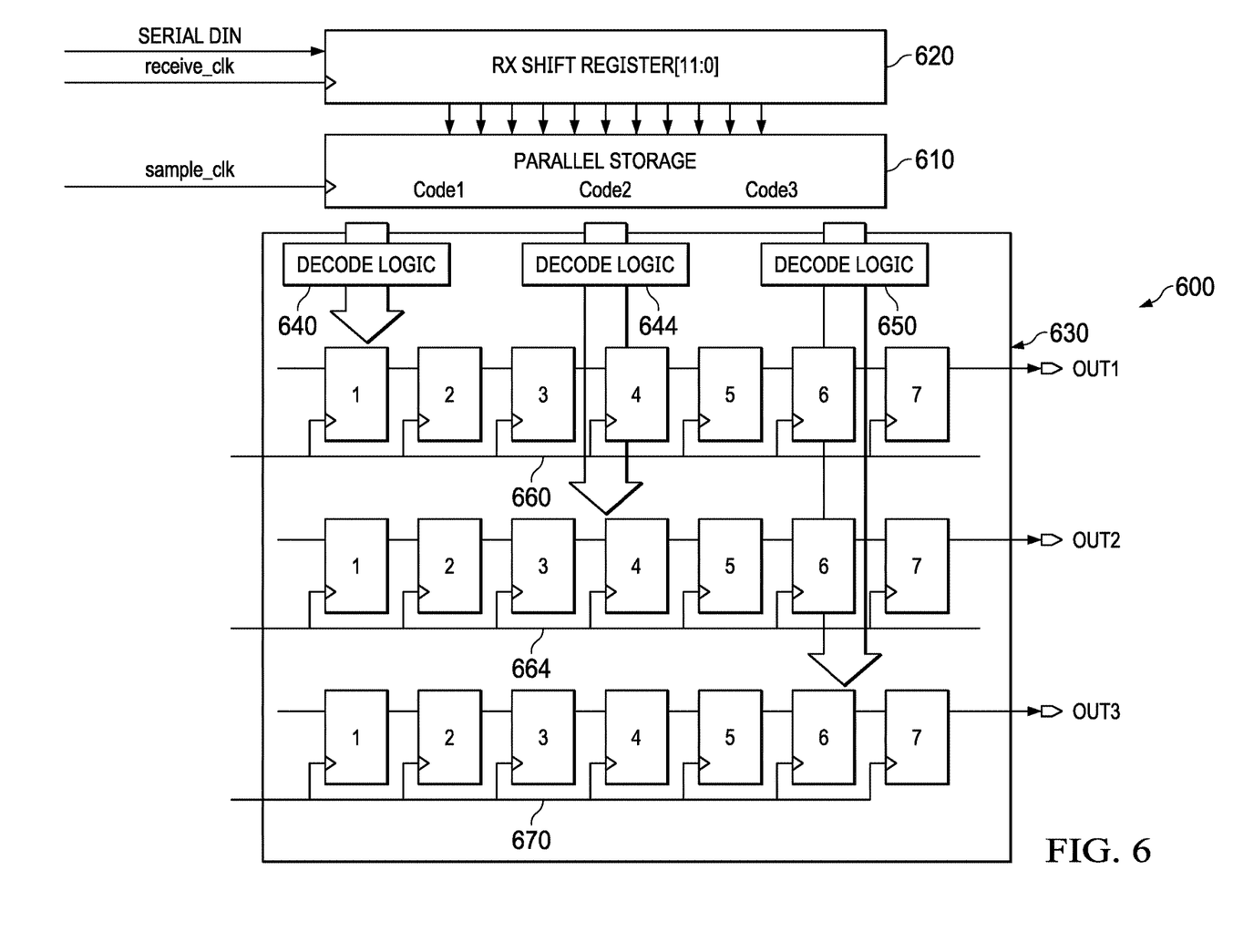
FIG. 6 illustrates an alternative example output stage and edge decoder to decode signal edge locations in a serial data stream for communicating timing and/or control information.

FIG. 6 illustrates another example deserializer circuit 600 that is an that includes an output stage 610, receiver 620, and edge decoder 630 to decode signal edge locations in a serial data stream for communicating timing and control information in a motor drive circuit. The receive shift register 620 captures the packet frame from the serial data stream in response to a receive clock signal (receive_clk) to shift the serial data stream into the receive shift register. The output stage 610 can also include a parallel storage register to store separate output codes captured by the receive shift register 620. The output codes represent an edge location and a polarity (shown as edge 1, 2, and 3) for each of the input signals specified in the packet frame of the serial data stream. The edge decoder 630 includes a separate decoder 640, 644, and 650 and an output shift register 660, 664, and 670 to decode each of the separate output codes. A respective decoder receives one of the separate output codes and generates an output bit pattern that emulates the sampled input signals of input stage based on the packet frame stored in the parallel storage register of the output stage 510. The output bit pattern is loaded into the respective output shift register from the respective decoder and clocked to an output of the output stage.

Figure 7:
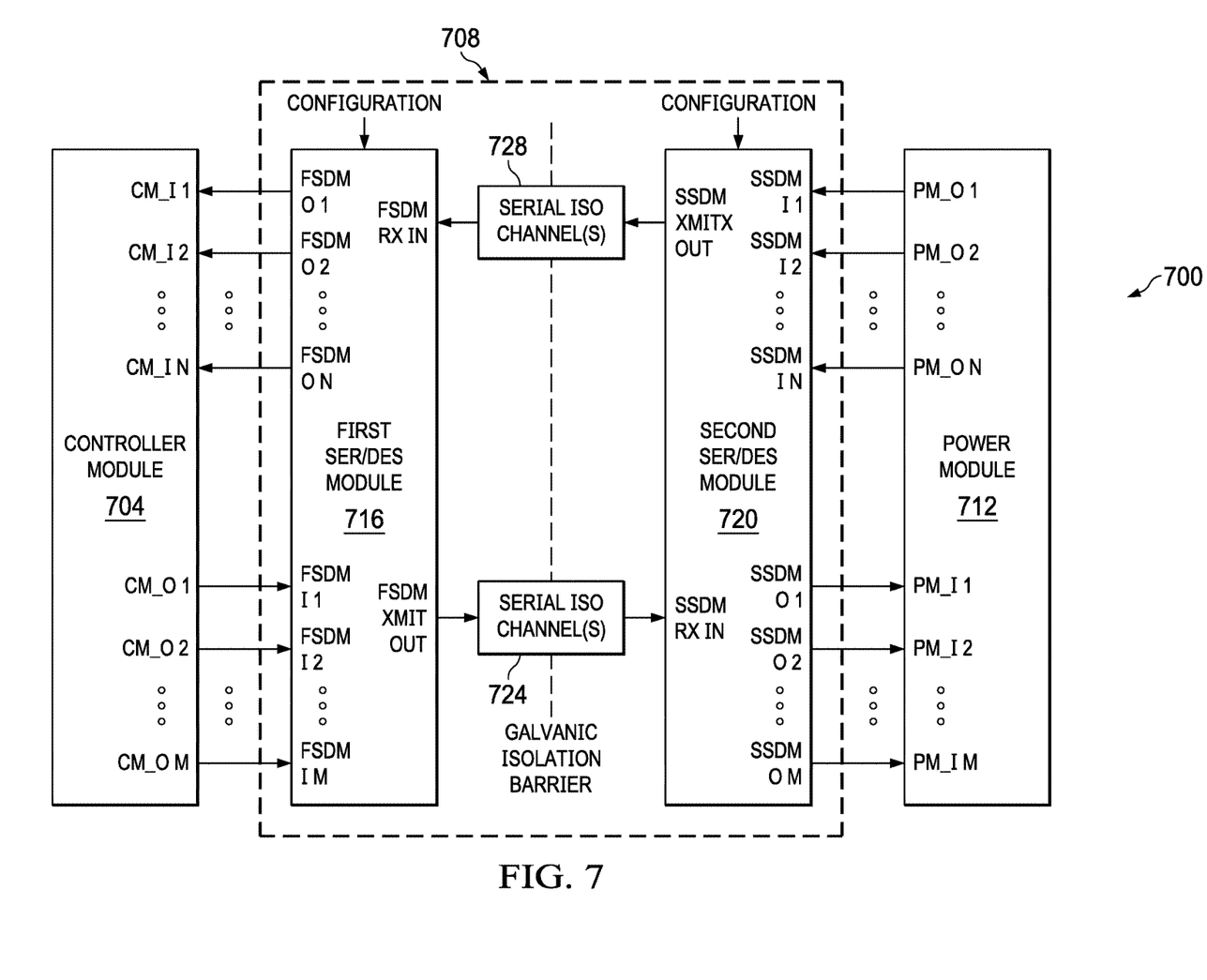
FIG. 7 illustrates an example system to convert controller and power signals to serial signals.

FIG. 7 illustrates an example serializer-deserializer (SER-DES) system 700 to convert communicate controller and/or timing signals of a motor drive circuit. The system 700 includes a motor controller module 704 having motor controller outputs shown as CM_O1 through CM_OM and motor controller inputs shown as CM_I1 through CM_IN, where N and M are positive integers. The motor controller module 704 communicates with a motor drive power module 712 via a motor drive communication circuit 708. The motor drive power module 712 includes motor drive power outputs shown as PM_O1 through PM_ON and motor drive power inputs shown as PM_I1 through PM_IM.

Example outputs of the motor controller module 704 include pulse width modulated (PWM) drive signals to drive high and low-side drivers of a three-phase motor and clock signals to be used by power module ADC circuits that digitize motor feedback information such as phase current detected in a given winding of the three-phase motor. One or more groupings (e.g., sets) of the outputs from the motor controller module 704 can be serialized and de-serialized by the motor drive communication circuit 708 and received by the motor drive power module 712 as inputs to control the three-phase motor. Additionally or alternatively, one or more groupings of outputs from the motor drive power module 712 can be serialized and de-serialized by the motor drive communication circuit 708 and received by the power module 712 as inputs. Example outputs from the power module 712 can include serial analog-to-digital (ADC) signals representing phase current and/or voltage, diagnostic information including phase fault status and motor power status.

The motor drive communication circuit 708 includes a first SER-DES module 716 that converts a first SER-DES input serial data stream (FSDM RX IN) into first SER-DES output signals (FSDM O1 through FSDM ON) which in turn drive the inputs of the motor controller module 704. Additionally or alternatively, the first SER-DES module 716 converts first SER-DES input signals (FSDM I1 through FSDM IM) into a first SER-DES output serial data stream (FSDM XMIT OUT). As shown, the first SER-DES output signals (FSDM O1 through FSDM ON) are associated with motor controller inputs and the first SER-DES input signals (FSDM I1 through FSDM IM) are associated with motor controller outputs.

A second SER-DES module 720 converts a second SER-DES input serial data stream (SSDM RX IN) into second SER-DES output signals (SSDM O1 through SSDM OM), which provide corresponding inputs the power module 712. Additionally or alternatively, the second SER-DES module 720 converts second SER-DES input signals (SSDM I1 through SSDM IN) into a second SER-DES output serial data stream (SSDM XMIT OUT). The second SER-DES output signals (SSDM O1 through SSDM OM) are associated with motor drive power inputs and the second SER-DES input signals (SSDM I1 through SSDM IN) are associated with motor drive power outputs. Each of the SER-DES modules 716 and 720 can include a configuration input (CONFIG) which allows a user to program which connections of the motor controller module 704 and the motor drive power module 712 are connected to the respective SER-DES modules as inputs or outputs.

One or more serial isolation channels 724 and 728 provide communication through a galvanic isolation barrier 730 between the first SER-DES module 716 and the second SER-DES module 720. The serial isolation channel 724 communicates the first SER-DES output serial data stream (FSDM XMIT OUT) in one direction across the galvanic isolation barrier 730 to provide the second SER-DES input serial data stream (SSDM RX IN). The serial isolation channel 728 communicates the second SER-DES output serial data stream (SSDM XMIT OUT) in another direction across the galvanic isolation barrier 730 to provide the first SER-DES input serial data stream (FSDM RX IN). The isolation channels 724 and 728 can include substantially any type circuit that allows communication of signals from one side of the galvanic isolation barrier 730 to the other without also sharing common direct current (DC) paths, such as ground. Example isolation channels can include capacitive isolators, transformers, Hall effect isolators and optical isolators. The first and second SER-DES modules 716 and 720 and the serial isolation channels 724 and 728 can be implemented on an integrated circuit substrate in one example or a printed circuit board substrate in another example. Other examples aspects of the respective SER-DES modules are illustrated and described with respect to the example of FIG. 8.

Figure 8:
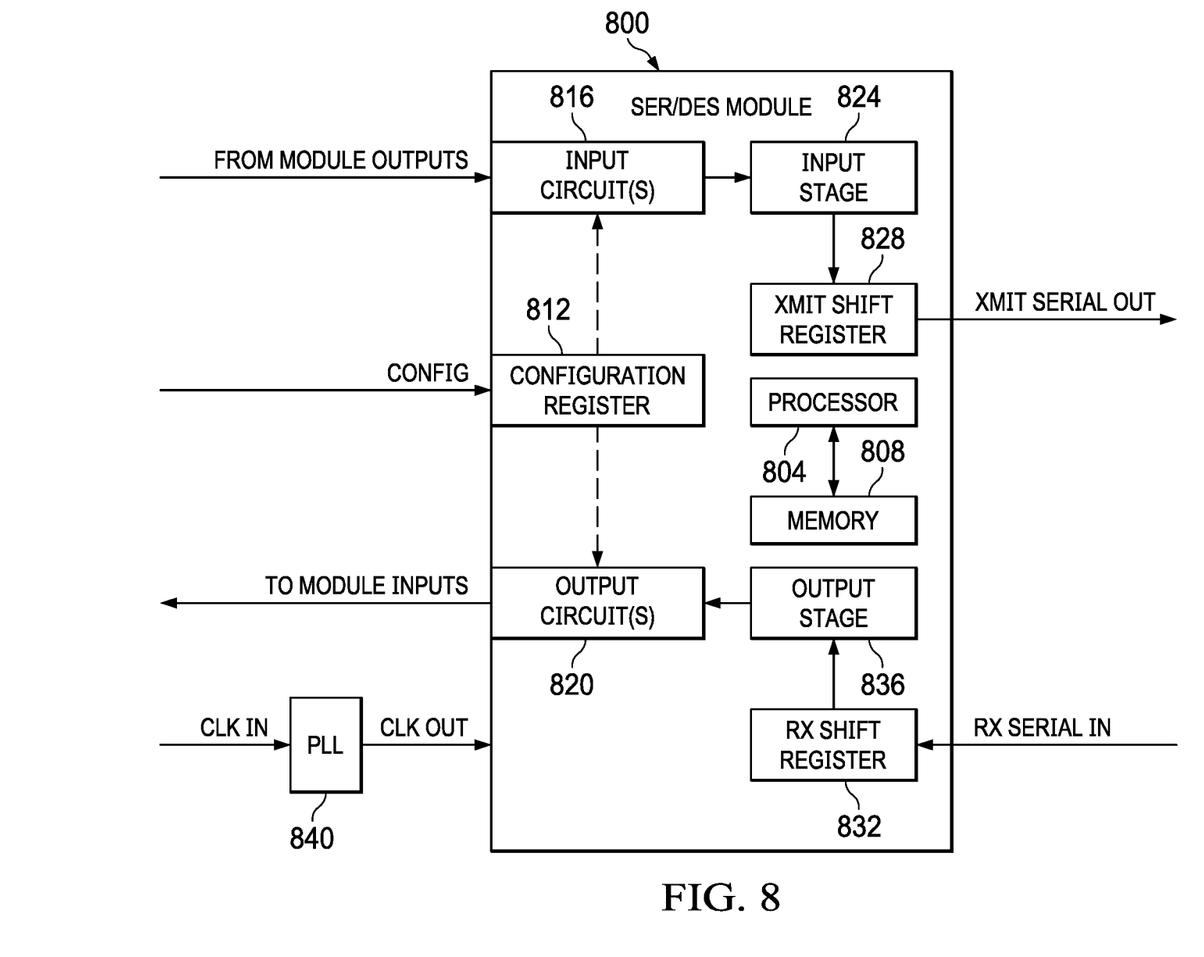
FIG. 8 illustrates an example of a serializer-deserializer (SER-DES) module for communicating signals between a controller module and a drive power module.

FIG. 8 illustrates an example of a SER-DES module 800 to reduce isolation circuitry between a motor controller module (e.g., module 704) and a motor drive power module (e.g., module 712). The SER-DES module 800 can be connected to either of the motor controller module or the motor drive power module for communicating signals across a galvanic barrier shown in FIG. 7. For example, the SER-DES module 800 can include a processor 804 and memory 808 to execute the respective SER-DES functionality described herein. In another example where a discrete processor and memory is not used, the SER-DES module 800 processing functions can be implemented as a state machine. The SER-DES module 800 includes a configuration register 812 to receive configuration input (CONFIG) that programs the SER-DES module. For example, the CONFIG input programs the number of controller module inputs and/or outputs to connect from the controller module if connected to the controller module, and the number of power module inputs and/or outputs to connect from the power module if connected to the power module. The configuration register 812 controls which controller/power module outputs are connected to input circuits 816 (e.g., buffers to store data) and which controller/power module inputs are connected to output circuits (e.g., drivers) which drive the module inputs.

The SER-DES module 800 includes an input stage 824 to encode data received from the input circuits 816 into an output serial data stream XMIT SERIAL OUT. A transmit shift register 828 is coupled to the input stage 824 to transmit the output serial data stream XMIT SERIAL OUT via the serial isolation channel described herein. A receive shift register 832 receives an input serial data stream RX SERIAL IN from the isolation channel described herein. An output stage 836 is coupled to the receive shift register 832 to decode the serial input data stream RX SERIAL IN and to provide parallel signals to the output circuits 820 that drive module inputs of the respective controller or power module. The input stage 824 encodes and formats a packet frame (see e.g., FIG. 3) that is to be communicated in the output serial data stream.

As an example, the packet frame includes data that specifies an edge location for a signal to begin at a given time period within the packet frame and an edge polarity that specifies a rising or falling edge for the signal at the edge location. The packet frame can be formatted according to a time division multiplexing (TDM) protocol in one example or a frequency division multiplexing (FDM) protocol in another example. A phased-locked loop (PLL) 840 can be provided to synchronize timing transmitted within the serial data streams communicated between the respective modules. The PLL 840 receives an input clock CLK IN from the respective controller or power module and generates an output clock CLK OUT to drive the SER-DES module 800.

In view of the foregoing structural and functional features described hereinabove, an example method is described with reference to FIG. 9. For simplicity of explanation, the method is shown and described as executing serially, but the method is not limited by the illustrated order, as parts of the method could occur in different orders and/or concurrently from that shown and described herein. Such method can be executed by various hardware circuits and components configured to execute machine readable instructions stored in memory and executable by an integrated circuit, a controller or a processor, for example.

Figure 9:
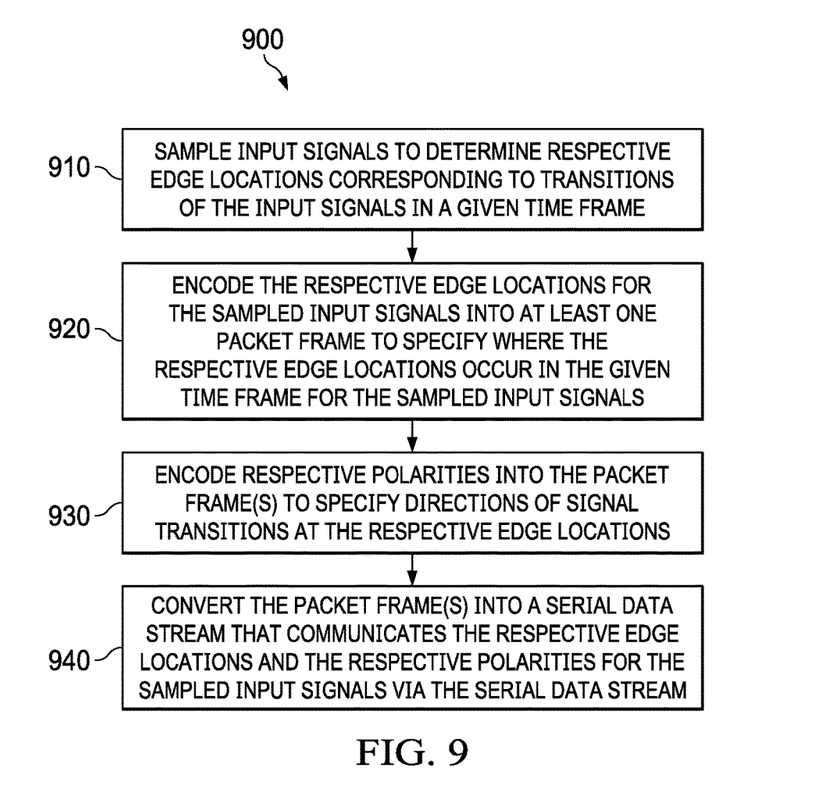
FIG. 9 illustrates an example method to communicate serial signals between a controller module and a motor drive module.

FIG. 9 illustrates an example method 900 to communicate serial signals between a motor controller module and a motor drive power module in a motor drive circuit. At 910, the method 900 includes sampling input signals to determine an edge location corresponding to a transition in each of the input signals in a given time frame (e.g., via input stage 120 of FIG. 1). At 920, the method 900 includes encoding the edge location for each sample of the input signals into a packet frame that specifies where the edge location occurs in the given time frame for each of the respective input signals (e.g., via edge encoder 124 of FIG. 1). At 930, the method 900 includes encoding a polarity in the packet frame that specifies a direction of a signal transition at the edge location for each of input signals (e.g., via edge encoder 124 of FIG. 1). At 940, the method 900 includes converting each packet frame into a serial data stream that communicates the edge location and the polarity for each of the input signals via the serial data stream (e.g., via transmitter 130 of FIG. 1). The method 900 can also include decoding the edge location and the polarity from the packet frame with respect to the given time frame to generate parallel output signals to communicate control information with a motor power module or a motor controller module.

In this description, the term "based on" means based at least in part on. Modifications are possible in the described embodiments, and other embodiments are possible, within the scope of the claims.

What is claimed is:

1. A circuit comprising:
   a serializer module including:
   an input stage having an input stage input and an input stage output, the input stage configured to sample an input signal at the input stage input, and capture an edge location for the input signal in a time frame, and provide the edge location at the input stage output;
   an edge encoder having an encoder input and an encoder output, the encoder input coupled to the input stage output, and the edge encoder configured to encode the edge location into a packet frame at the encoder output specifying where the edge location occurs in the time frame; and
   a transmitter having a transmitter input and a transmitter output, the transmitter input coupled to the encoder output, and the transmitter configured to receive the packet frame at the transmitter input, and convert the packet frame into a serial data stream, and communicate the edge location via the serial data stream at the transmitter output; and
   a deserializer module including:
   a receiver having a receiver input and a receiver output, the receiver input coupled to the transmitter output, and the receiver configured to receive the serial data stream at the receiver input, and to provide the packet frame at the receiver output;
   a buffer;
   an output stage having an output stage input and an output stage output, the output stage input coupled to the receiver output, the output stage output coupled to the buffer, and the output stage configured to receive the packet frame at the output stage input and write the packet frame into the buffer; and
   an edge decoder having a decoder input and a decoder output, the decoder input coupled to the buffer, the decoder output adapted to be coupled to a motor power module or a motor controller module, and the edge decoder configured to decode the edge location from the packet frame in the buffer with respect to the time frame, and to generate an output signal at the decoder output to communicate control information with the motor power module or the motor controller module.

2. The circuit of claim 1, wherein the input stage includes a shift register configured to capture an edge transition responsive to a sample clock for the input signal.

3. The drive circuit of claim 2, wherein the edge transition includes one input signal transition from a high state to a low state or from a low state to a high state within a number of clock transitions of the sample clock.

4. The circuit of claim 1, wherein the packet frame includes: data specifying the edge location for a signal transition to begin at a time period within the packet frame; and an edge polarity specifying a rising or falling edge for the signal transition at the edge location.

5. The circuit of claim 1, wherein the receiver includes a receive shift register configured to capture the packet frame from the serial data stream at the receiver input, responsive to a receive clock signal, and to shift the serial data stream into the receive shift register.

6. The circuit of claim 5, wherein the buffer in the output stage includes a parallel storage register configured to store an output code captured by the receive shift register, the output code representing the edge location and a polarity for the input signal specified in the packet frame of the serial data stream.

7. The circuit of claim 6, wherein the edge decoder includes a comparator and a counter configured to analyze the output code, including by the comparator comparing the output code to a counter value to determine the edge location from the packet frame stored in the parallel storage register, an edge polarity bit in the packet frame being clocked to an output of the output stage responsive to the comparator matching the counter value to the output code.

8. The circuit of claim 6, wherein the edge decoder includes a decoder and an output shift register configured to decode the output code, including by the decoder receiving the output code and generating an output bit pattern, to emulate the sampled input signal of the input stage based on the packet frame stored in the parallel storage register, the output bit pattern being loaded into the output shift register from the decoder and clocked to an output of the output stage.

9. The circuit of claim 1, wherein each of the serializer and deserializer modules includes a respective phased-locked loop (PLL) configured to synchronize the serial data streams communicated between the respective modules.

10. The circuit of claim 1, wherein the edge encoder is configured to encode multiple signal edge locations for multiple input signals sampled by the input stage concurrently, while maintaining timing between input signal edge locations within the packet frame.

11. A circuit, comprising:
a deserializer module including:
    a receiver having a receiver input and a receiver output, the receiver configured to receive a serial data stream from the receiver input, the serial data stream including at least one packet frame specifying respective edge locations for input signals from the transmitter in a time frame;
    a buffer;
    an output stage having an output stage input and an output stage output, the output stage input coupled to the receiver output, the output stage output coupled to the buffer, and the output stage configured to receive the packet frame at the output stage input and write the packet frame(s) into the buffer; and
    an edge decoder having a decoder input and a decoder output, the decoder input coupled to the buffer, the decoder output adapted to be coupled to a motor power module or a motor controller module, and the edge decoder configured to decode the respective edge locations from the packet frame(s) in the buffer with respect to the time frame, and to generate parallel output signals at the decoder output to communicate control information with the motor power module or the motor controller module; and a serializer module including:
    an input stage having an input stage input and an input stage output, the input stage configured to sample the input signals at the input stage input, and determine the respective edge locations for the input signals in the time frame, and provide the respective edge locations at the input stage output;
    an edge encoder having an encoder input and an encoder output, the encoder input coupled to the input stage output, and the edge encoder configured to encode the respective edge locations into the packet frame(s) at the encoder output specifying where the respective edge locations occur in the time frame; and
    a transmitter having a transmitter input and a transmitter output, the transmitter input coupled to the encoder output, the transmitter output coupled to the receiver input, and the transmitter configured to receive the packet frame(s) at the transmitter input, and send the packet frame(s) as the serial data stream to the receiver input.

12. The circuit of claim 11, wherein the packet frame(s) include(s): data specifying the respective edge locations for signal transitions to begin at time periods within the packet frame(s); and respective edge polarities specifying rising or falling edges for the signal transitions at the respective edge locations.

13. The circuit of claim 11, wherein the receiver includes a receive shift register configured to capture the packet frame(s) from the serial data stream at the receiver input, responsive to a receive clock signal, and to shift the serial data stream into the receive shift register.

14. The circuit of claim 13, wherein the buffer in the output stage includes a parallel storage register configured to store output codes captured by the receive shift register, the output codes representing the respective edge locations and respective polarities for the input signals specified in the packet frame(s) of the serial data stream.

15. The circuit of claim 14, wherein the edge decoder includes respective comparators and counters configured to decode the output codes, including by each respective comparator comparing a respective one of the output codes to a respective counter value to determine one of the respective edge locations from the packet frame(s) stored in the parallel storage register, an edge polarity bit in the packet frame(s) being clocked to an output of the output stage responsive to the respective comparator matching the respective counter value to the respective one of the output codes.

16. The circuit of claim 14, wherein the edge decoder includes respective decoders and output shift registers configured to decode the output codes, including by each respective decoder receiving a respective one of the output codes and generating a respective output bit pattern, to emulate the sampled input signals of the input stage based on the packet frame(s) stored in the parallel storage register, the output bit patterns being loaded into the output shift registers from the decoders and clocked to an output of the output stage.

* * * * *